US009733309B2

(12) United States Patent
Li

(10) Patent No.: US 9,733,309 B2
(45) Date of Patent: Aug. 15, 2017

(54) BUILT-IN SELF-TEST CIRCUIT

(71) Applicant: Shanghai Huahong Grace Semiconductor Manufacturing Corporation, Shanghai (CN)

(72) Inventor: Ming Li, Shanghai (CN)

(73) Assignee: SHANGHAI HUAHONG GRACE SEMICONDUCTOR MANUFACTURING CORPORATION, Shanghai (CN)

( * ) Notice: Subject to any disclaimer, the term of this patent is extended or adjusted under 35 U.S.C. 154(b) by 0 days.

(21) Appl. No.: 14/962,626

(22) Filed: Dec. 8, 2015

(65) Prior Publication Data

US 2016/0306010 A1 Oct. 20, 2016

(30) Foreign Application Priority Data

Apr. 17, 2015 (CN) .......................... 2015 1 0189284

(51) Int. Cl.
| G01R 31/3185 | (2006.01) |
| G11C 29/12 | (2006.01) |
| G11C 29/16 | (2006.01) |
| G11C 29/36 | (2006.01) |
| G11C 29/48 | (2006.01) |
| G01R 31/317 | (2006.01) |
| G11C 16/00 | (2006.01) |

(52) U.S. Cl.
CPC .. *G01R 31/318597* (2013.01); *G11C 29/1201* (2013.01); *G11C 29/16* (2013.01); *G11C 29/36* (2013.01); *G11C 29/48* (2013.01); *G01R 31/31724* (2013.01); *G01R 31/318572* (2013.01); *G11C 16/00* (2013.01)

(58) Field of Classification Search
CPC ...................................................... G01R 31/31
USPC .................. 714/738, 724, 744, 726, 719, 45
See application file for complete search history.

(56) References Cited

U.S. PATENT DOCUMENTS

| 7,163,273 | B2 * | 1/2007 | Silverbrook | ......... | B41J 2/14427 |
| | | | | | 347/19 |
| 7,234,645 | B2 * | 6/2007 | Silverbrook | ............... | B41J 2/14 |
| | | | | | 235/454 |
| 7,483,053 | B2 * | 1/2009 | Silverbrook | ............. | B41J 2/155 |
| | | | | | 347/2 |
| 7,511,744 | B2 * | 3/2009 | Silverbrook | ............... | B41J 2/14 |
| | | | | | 348/207.2 |
| 8,862,955 | B2 * | 10/2014 | Cesari | .............. | G01R 31/31855 |
| | | | | | 714/726 |

(Continued)

*Primary Examiner* — Fritz Alphonse
(74) *Attorney, Agent, or Firm* — Muncy, Geissler, Olds & Lowe, PC

(57) ABSTRACT

A built-in self-test (BIST) circuit is disclosed which integrates the functions of pins for test input data TDI, test output data TDO and an analog input signal VPP into a single digital/analog input/output module, and internally produces a test trigger signal STROBE and a digital-analog conversion signal ANA. In addition, when there is a need to power the test chip with a voltage or current, a data generation circuit of the BIST circuit can generate a digital-analog conversion signal to change an operating mode of the digital/analog input/output module and hence enable the transmission of analog data. According to the present invention, the testing can be performed with only two pins, which leads to an improvement in test efficiency and a reduction in test cost.

6 Claims, 3 Drawing Sheets

(56) References Cited

U.S. PATENT DOCUMENTS 8,922,791 B2 * 12/2014 Silverbrook ............... B41J 2/14
348/207.2

* cited by examiner

BUILT-IN SELF-TEST CIRCUIT

CROSS-REFERENCES TO RELATED APPLICATIONS

This application claims the priority of Chinese patent application number 201510189284.8, filed on Apr. 17, 2015, the entire contents of which are incorporated herein by reference.

TECHNICAL FIELD

The present invention relates to read-out circuits and, in particular, to a read-out circuit for use in a built-in self-test (BIST) circuit in a semiconductor memory device.

BACKGROUND

As semiconductor process dimensions continue to shrink, integrated circuit (IC) designs scale up increasingly. Requirements imposed on highly complex ICs become more and more stringent, such as higher reliability, higher quality, lower cost and shorter time-to-market cycles. On the one hand, the shrinking semiconductor process dimensions lead to more types of possible deficiencies of embedded memory devices. On the other hand, with the complexity of IC products increasing, the proportion of ROMs, RAMs, and EEPROMs therein continues to rise.

Design-for-Testability (DFT) techniques for embedded memory devices include direct testing, embedded CPU-based testing and Memory Built-in Self-Test (MBIST). MBIST is advantageous over the other two schemes in many aspects. Firstly, MBIST allows automatic DFT and automatic realization of test algorithms for general memory devices, and can thus achieve high test quality and low test cost. Secondly, MBIST circuits are capable of "full speed" testing based on the system clock and can thus cover more generated defects and reduce testing time. Thirdly, MBIST imparts self-diagnosis and self-repairing capacities to most memory devices. In addition, MBIST initialization test vectors can be run on very low cost test equipment. Therefore, MBIST is currently a mainstream DFT technique for embedded memory devices in view of high test quality and low test cost.

FIG. 1 is a schematic diagram of a first MBIST circuit of the prior art. As shown in FIG. 1, at the beginning of a testing process, a test instrument (not shown) delivers a reset signal to a test chip or wafer via a pin RESETb to restore the control logic circuit to its primary default state and powers the test chip or wafer via another pin VPP TM0. During the testing process, the test instrument transmits input data TDI at a clock frequency TCK. After being decoded by a MBIST control circuit, the input data TDI are activated by a trigger signal STROBE from the test instrument and then cooperate with the control logic circuit to test the circuit of the memory device such as a flash memory device. With the testing being completed, the test data or results are returned to the test instrument as test output data TDO under the control of the control logic circuit. The test instrument then compares the input TDI and output TDO and thereby verifies whether the circuit of the memory device such as a flash memory device meets or satisfies the predefined performance criteria.

For the MBIST circuit, the number of its control pins directly determines how many chip dies the MBIST circuit can test at the same time. As described above, the MBIST circuit of the prior art requires six pins, i.e., those for the test input data TDI, test output data TDO, test trigger signal STROBE, test clock TCK, test power supply VPP_TM0 and reset signal RESETb, indicated by the crossed boxes in FIG. 1. Given the fact that a typical probe card has 768 signal testing probes, and since the MBIST circuit of the prior art requires 6 pins, the number of simultaneously testable chip dies is 768/6=128, which is not efficient.

Referring now to FIG. 2, which is a schematic diagram of a second MBIST circuit of the prior art, in order to reduce the number of used pins, the second MBIST circuit replaces the pins TDI and TDO for the test input and out data with a single data interface pin IO, and internally generates the test trigger signal and reset signal. As a result, three pins are saved, and the MBIST circuit requires only three pins, indicated by the crossed boxes in FIG. 2. This leads to an improvement in test efficiency.

However, even though the second MBIST circuit has achieved the saving of three pins, the number of chips dies that it can test at the same time is only 768/3=256. In order to further enhance the test efficiency, there is still a need for a MBIST circuit that requires the use of fewer pins.

SUMMARY OF THE INVENTION

It is therefore the objective of the present invention to provide built-in self-test (BIST) circuit which can combine the functions of the test power supply pin for dealing with analog signals and the IO pins for dealing with digital signals into a single pin, thereby enabling use of only two test pins, increasing the number of simultaneously testable chip dies and further augmenting test efficiency.

In pursuit of this objective, the present invention proposes a BIST circuit for testing a test chip. The circuit includes: a digital/analog input/output module coupled to the test chip and configured to input digital or analog test input data to the test chip or output digital or analog test output data from the test chip via a first pin; an instruction analysis circuit having a first input terminal for receiving the test input data from the digital/analog input/output module and a second input terminal configured to be coupled to a clock signal via a second pin; and a data generation circuit configured to output a direction control signal and analog-digital conversion data to the digital/analog input/output module based on both the clock signal and a test trigger signal produced by the instruction analysis circuit. The direction control signal configured to instruct the digital/analog input/output module to operate in an input mode or an output mode. The analog-digital conversion data is configured to switch the digital/analog input/output module between an analog mode and a digital mode. The data generation circuit is further configured to process returned data from the test chip into the test output data and output the test output data to the first pin. The BIST circuit does not include other pins than the first pin and the second pin.

Further, in the BIST circuit, the data generation circuit may generate the analog-digital conversion data based on the test trigger signal.

Further, in the BIST circuit, the analog-digital conversion data may return to an initial state after predetermined cycles of the clock signal.

Further, in the BIST circuit, the digital/analog input/output module may be a bidirectional input/output module.

Further, in the BIST circuit, the data generation circuit may be coupled to the test chip and configured to transmit digital data.

Further, in the BIST circuit, the test chip internally may produce a test reset signal that is output to the data generation circuit to enable a reset operation.

The present invention is beneficial over the prior art designs majorly in that, the BIST circuit integrates the functions of pins for test input data TDI, test output data TDO and an analog input signal VPP into a single digital/analog input/output module, internally produces a test trigger signal STROBE, a digital-analog conversion signal ANA and a reset signal RESET, and employs a data generation circuit which, upon a need to power the test chip, can generate analog-digital conversion data to change an operating mode of the digital/analog input/output module and hence enable the transmission of analog data. This allows use of only two pins in the testing, thereby improving test efficiency and reducing test cost.

DETAILED DESCRIPTION

Built-in self-test (BIST) circuits according to the present invention will be described in greater detail in the following description which presents preferred embodiments of the invention, in conjunction with the accompanying drawing. It is to be appreciated that those of skill in the art can make changes in the invention disclosed herein while still obtaining the beneficial results thereof. Therefore, the following description shall be construed as being intended to be widely known by those skilled in the art rather than as limiting the invention.

For simplicity and clarity of illustration, not all features of the specific embodiments are described. Additionally, descriptions and details of well-known functions and structures are omitted to avoid unnecessarily obscuring the invention. The development of any specific embodiment of the present invention includes specific decisions made to achieve the developer's specific goals, such as compliance with system related and business related constraints, which will vary from one implementation to another. Moreover, such a development effort might be complex and time-consuming but would nevertheless be a routine undertaking for those of ordinary skill in the art.

The present invention will be further described in the following paragraphs by way of example with reference to the accompanying drawing. Features and advantages of the invention will be more apparent from the following detailed description, and from the appended claims. Note that the accompanying drawing is provided in a very simplified form not necessarily presented to scale, with the only intention of facilitating convenience and clarity in explaining a few exemplary embodiments of the invention.

Figure 1:
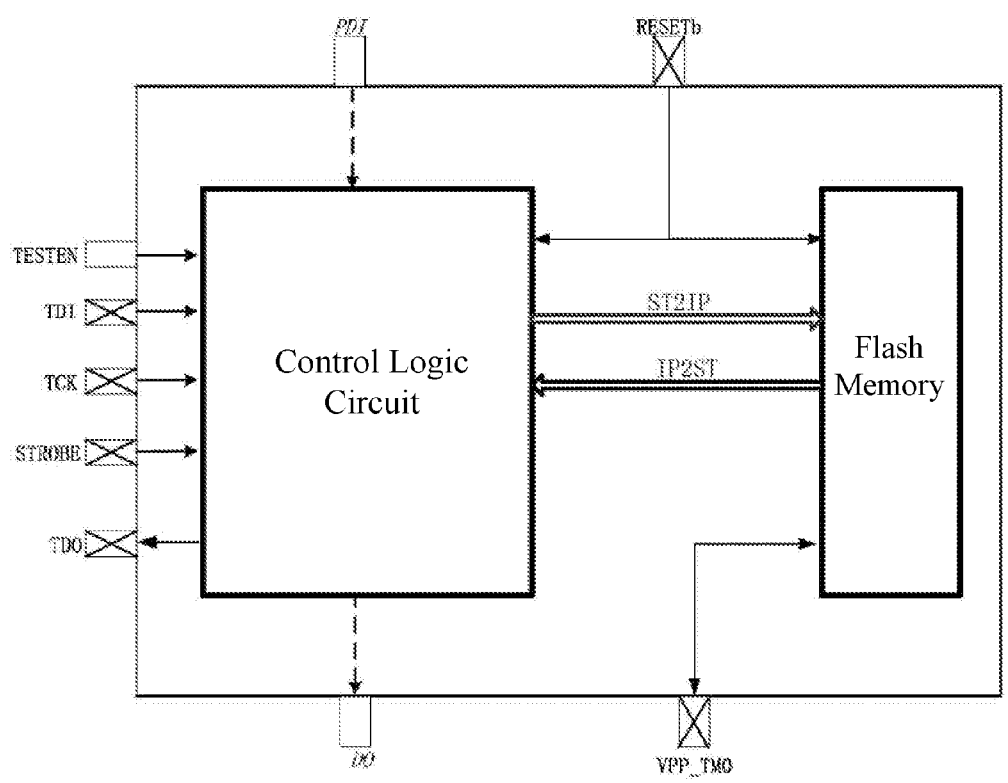
FIG. 1 is a schematic diagram of a first MBIST circuit of the prior art.
Figure 2:
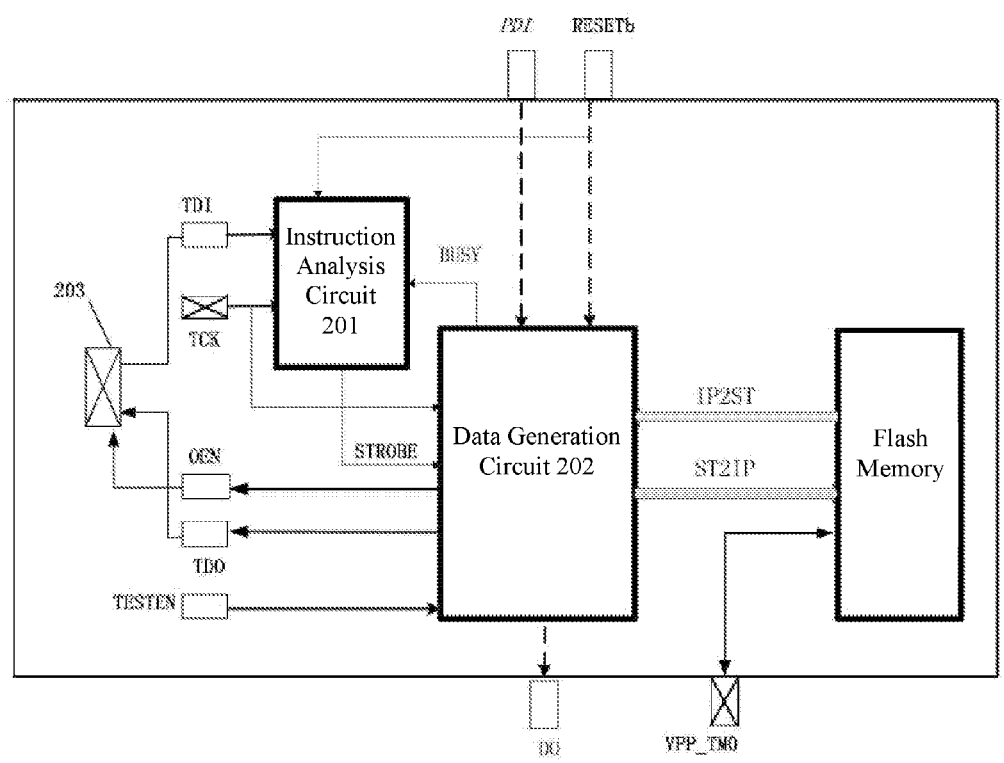
FIG. 2 is a schematic diagram of a second MBIST circuit of the prior art.
Figure 3:
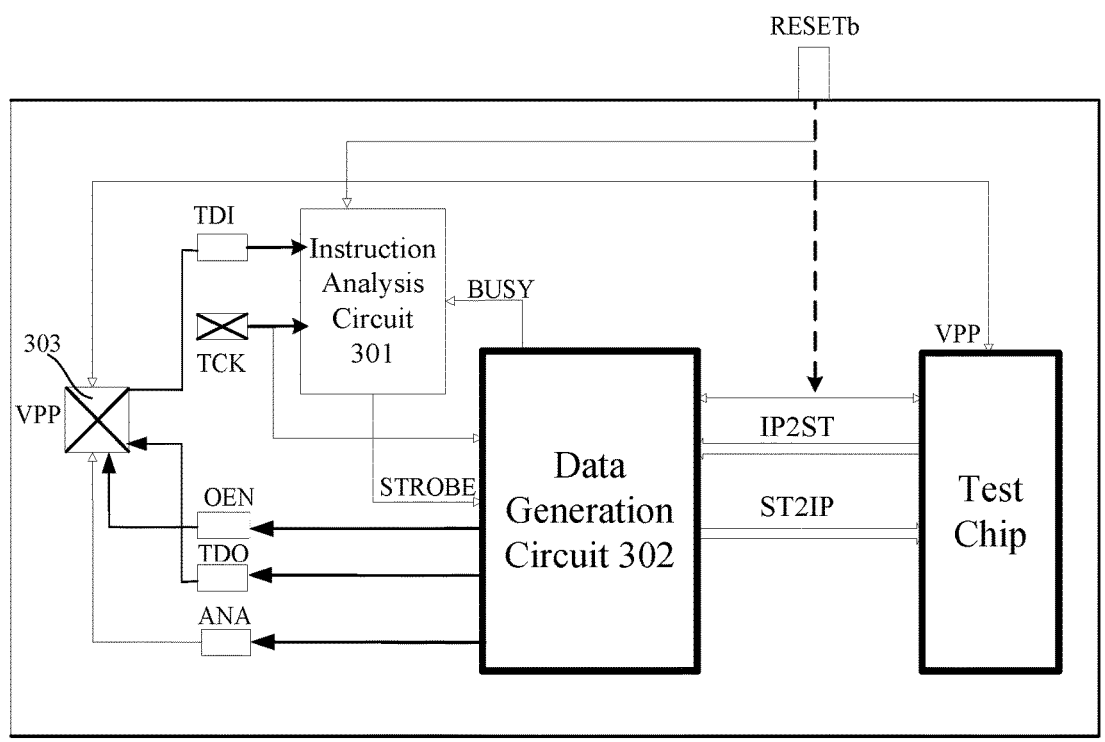
FIG. 3 is a schematic diagram of a BIST circuit constructed in accordance with an embodiment of the present invention.

FIG. 3 diagrammatically illustrates a BIST circuit requiring the use of only two pins, constructed in accordance with an embodiment of the present invention. The BIST circuit is used to test a test chip (e.g., a memory device) and includes: an instruction analysis circuit 301, a data generation circuit 302 and a digital/analog input/output module 303. The instruction analysis circuit 301 has an input terminal for receiving test input data TDI from the digital/analog input/output module 303. A first pin TCK of the BIST circuit is coupled to a test clock and configured to input a clock signal to another input terminal of the instruction analysis circuit 301 and to the data generation circuit 302. The data generation circuit 302 is configured to output test output data TDO, a direction control signal OEN and analog-digital conversion data ANA to the digital/analog input/output module 303. The direction control signal OEN is configured to select an input or output direction, i.e., the direction control signal OEN controls the digital/analog input/output module 303 to operate in an input mode or an output mode, and the analog-digital conversion data ANA is configured to select an analog-digital conversion mode of the digital/analog input/output module 303. The digital/analog input/output module 303 is coupled to the test chip and is configured to input or output digital or analog data via a second pin VPP of the BIST circuit.

The instruction analysis circuit 301 is configured to produce a test trigger signal STROBE and output the test trigger signal STROBE to the data generation circuit 302. The data generation circuit 302 generates the analog-digital conversion data ANA based on the output test trigger signal STROBE. The analog-digital conversion data ANA return to an initial state after predetermined cycles (e.g., 10 cycles) of the clock signal. The digital/analog input/output module 303 is a bidirectional input/output module. The data generation circuit 302 is coupled to the test chip and is configured to test the transmitted data.

In addition, in preferred embodiments of the present invention, the test trigger signal STROBE is produced by the instruction analysis circuit 301 and output to the data generation circuit 302. Moreover, a test reset signal RESETb is internally produced in the test chip and output to the data generation circuit 302, in order to enable a reset operation. Further, other signals same as those used in the prior art may also be generated and have the corresponding functions, and further description of them is omitted herein.

Working principles of the present invention will be described below in greater details with reference to FIG. 3. At the beginning of a testing process, the direction control signal OEN controls the digital/analog input/output module (bidirectional input/output module) 303 to operate in an input mode, allowing the second pin VPP to input the test input data TDI into the instruction analysis circuit 301. The test input data TDI is, together with the test clock TCK (input via the first pin TCK), transmitted to the instruction analysis circuit 301 which, in turn, outputs the test trigger signal STROBE. Under the action of the test trigger signal STROBE, the data generation circuit 302 starts to operate and tests the circuit of a memory device such as a flash memory device. Upon completion of the testing, the returned data are processed by the data generation circuit 302 into the test output data TDO, and the direction control signal OEN instructs the digital/analog input/output module (bidirectional input/output module) 303 to operate in an output mode so as to allow the test output data TDO to be output to the second pin VPP. When there is a need to input an analog signal such as, for example, a test voltage or a test current, to the memory device such as a flash memory device, the instruction analysis circuit 301 may produce the test trigger signal STROBE as being able to trigger the data generation circuit 302 to generate the analog-digital conversion data ANA that is at a high level. The analog-digital conversion data ANA is then transmitted to the digital/analog input/output module 303, thereby switching the digital/analog input/output module 303 to an analog mode. As such, the analog signal (e.g., a voltage or current) can be input to or output from the flash memory device via the second pin VPP.

In summary, in BIST circuits consistent with embodiments of the present invention, functions of pins for test input data TDI, test output data TDO and an analog input signal VPP are integrated into a single digital/analog input/output module, and a test trigger signal STROBE and a digital-analog conversion signal ANA are internally produced. In addition, when there is a need to power the test chip with a voltage, a data generation circuit can generate digital-analog conversion data to change an operating mode of the digital/analog input/output module and hence enable the transmission of analog data. Therefore, according to the present invention, the testing can be performed with only two pins, which leads to an improvement in test efficiency and a reduction in test cost.

The foregoing description presents merely several preferred embodiments of the present invention and is not intended to limit the invention in any way. Any variations such as equivalent substitutions or modifications made to the subject matter or features disclosed herein by any person skilled in the art are all considered to be within the scope of the invention.

What is claimed is:

1. A built-in self-test (BIST) circuit for testing a test chip, comprising:

a digital/analog input/output module coupled to the test chip and configured to input digital or analog test input data to the test chip or output digital or analog test output data from the test chip via a first pin;

an instruction analysis circuit having a first input terminal for receiving the test input data from the digital/analog input/output module and a second input terminal configured to be coupled to a clock signal via a second pin; and a data generation circuit configured to output a direction control signal and analog-digital conversion data to the digital/analog input/output module based on both the clock signal and a test trigger signal produced by the instruction analysis circuit, the direction control signal configured to instruct the digital/analog input/output module to operate in an input mode or an output mode, the analog-digital conversion data configured to switch the digital/analog input/output module between an analog mode and a digital mode, the data generation circuit further configured to generate the test output data based on a test result from the test chip and output the test output data to the first pin, wherein the BIST circuit does not comprise other pins than the first pin and the second pin.

2. The BIST circuit according to claim 1, wherein the data generation circuit generates the analog-digital conversion data based on the test trigger signal.

3. The BIST circuit according to claim 2, wherein the analog-digital conversion data return to an initial state after predetermined cycles of the clock signal.

4. The BIST circuit according to claim 1, wherein the digital/analog input/output module is a bidirectional input/output module.

5. The BIST circuit according to claim 1, wherein the data generation circuit is coupled to the test chip and configured to transmit digital data.

6. The BIST circuit according to claim 5, wherein the test chip internally produces a test reset signal that is output to the data generation circuit to enable a reset operation.

* * * * *